United States Patent
Cox

(10) Patent No.: US 9,977,341 B2
(45) Date of Patent: May 22, 2018

(54) LITHOGRAPHIC APPARATUS AND DEVICE MANUFACTURING METHOD

(71) Applicant: ASML Netherlands B.V., Veldhoven (NL)

(72) Inventor: Henrikus Herman Marie Cox, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 162 days.

(21) Appl. No.: 14/766,112

(22) PCT Filed: Feb. 6, 2014

(86) PCT No.: PCT/EP2014/052355
§ 371 (c)(1),
(2) Date: Aug. 5, 2015

(87) PCT Pub. No.: WO2014/122223
PCT Pub. Date: Aug. 14, 2014

(65) Prior Publication Data
US 2016/0004172 A1 Jan. 7, 2016

Related U.S. Application Data

(60) Provisional application No. 61/762,654, filed on Feb. 8, 2013.

(51) Int. Cl.
*G03B 27/62* (2006.01)
*G03F 7/20* (2006.01)
*G05B 19/402* (2006.01)

(52) U.S. Cl.
CPC ...... *G03F 7/70633* (2013.01); *G03F 7/70725* (2013.01); *G05B 19/402* (2013.01)

(58) Field of Classification Search
CPC G03F 7/70633; G03F 7/70725; G05B 19/402
(Continued)

(56) References Cited

U.S. PATENT DOCUMENTS 7,379,156 B2   5/2008   Kunst et al.
7,657,334 B2   2/2010   De Vos et al.
(Continued)

FOREIGN PATENT DOCUMENTS

JP   2006-191084   7/2006
JP   2009-253287   10/2009
(Continued)

OTHER PUBLICATIONS

International Search Report dated Jun. 5, 2014 in corresponding International Patent Application No. PCT/EP2014/052355.
(Continued)

*Primary Examiner* — Peter B Kim
(74) *Attorney, Agent, or Firm* — Pillsbury Winthrop Shaw Pittman LLP

(57) ABSTRACT

A position control system includes a position measurement system including a first position measurement configuration arranged to determine a position of an object in a first operating area and a second position measurement configuration to determine a position of the object in a second operating area; and a control unit configured to control a position of the object, the control unit including a first and a second controller, the first and second controllers being arranged to convert an input signal representing a position of the object to a respectively first and second control signal, the control unit being arranged to determine a combined control signal for controlling the position of the object in an overlapping area of the first and second operating area,
(Continued)

wherein the combined control signal is obtained by applying a continuous weight function to the first and second control signal.

15 Claims, 10 Drawing Sheets

(58) Field of Classification Search
USPC .................................................... 355/72, 75
See application file for complete search history.

(56) References Cited

U.S. PATENT DOCUMENTS

| | | |
|---|---|---|
| 8,279,407 B2 | 10/2012 | Kamidi et al. |
| 2006/0139590 A1 | 6/2006 | Kunst et al. |
| 2007/0067057 A1 | 3/2007 | De Vos et al. |
| 2008/0094592 A1 | 4/2008 | Shibazaki |
| 2008/0094593 A1 | 4/2008 | Shibazaki |
| 2009/0279067 A1 | 11/2009 | Kamidi et al. |

FOREIGN PATENT DOCUMENTS

| | | |
|---|---|---|
| JP | 2012-138621 | 7/2012 |
| WO | 2011/081215 | 7/2011 |

OTHER PUBLICATIONS

International Preliminary Report on Patentability and Written Opinion dated Aug. 20, 2015 in corresponding International Patent Application No. PCT/EP2014/052355.

Japanese Office Action dated Apr. 3, 2017 in corresponding Japanese Patent Application No. 2015-556495.

(a)

(b)

LITHOGRAPHIC APPARATUS AND DEVICE MANUFACTURING METHOD

CROSS-REFERENCE TO RELATED APPLICATIONS

This application is the U.S. National Stage of PCT/EP2014/052355, filed Feb. 6, 2014, which in turn claims the benefit of priority to U.S. provisional application Ser. No. 61/762,654, which was filed on Feb. 8, 2013, the entire contents of all applications are incorporated herein by reference in their entireties.

FIELD

The present invention relates to a position control system, a lithographic apparatus, and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate. In order to ensure that the integrated circuit as produced operates properly, an accurate transfer of a pattern onto a target portion (in particular with respect to the position of a pattern in a lower layer of the integrated circuit) of the substrate is required. Further, a high performance with respect to throughput (i.e. the numbers of substrates processed per unit of time) is equally desired. As such, in order to meet these requirements, a high performance position control system is required for positioning the substrate relative to the patterning device (or a projection system of the apparatus). Typically, encoder based position measurement systems, or interferometer based position measurement systems or a combination thereof are applied. Further, as the substrate undergoes various processes throughout the lithographic apparatus, the overall operating area which is covered by a substrate table to which the substrate is mounted, is comparatively large, compared to the operating area that is used during the exposure of the substrate. Due to limitations (in particular manufacturing limitations or cost limitations), different position measurement systems or different configurations of similar position measurement systems are applied throughout the overall operating area. In order to cope with such different position measurement systems or different configurations of position measurement systems, a bandwidth of a position controller of the position control system may be adversely affected, thus adversely affecting the performance of the controller.

SUMMARY

It is desirable to provide a position control system enabling an improved performance, in particular in an operating area that is covered during an exposure process of a substrate. Therefore, in an embodiment of the present invention, there is provided a position control system comprising:

a position measurement system comprising a first position measurement configuration arranged to determine a position of an object in a first operating area and a second position measurement configuration to determine a position of the object in a second operating area;

a control unit for controlling a position of the object, the control unit comprising a first and second controller, the controllers being arranged to convert an input signal representing a position of the object to a resp. first and second control signal, the control unit being arranged to determine a combined control signal for controlling the position of the object in an overlapping area of the first and second operating area, whereby the combined control signal is obtained by applying a continuous weight function to the first and second control signal.

In another embodiment of the present invention, there is provided a lithographic apparatus comprising:

an illumination system configured to condition a radiation beam;

a support constructed to support a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate, and a position control system, the position control system comprising:

a position measurement system comprising a first position measurement configuration arranged to determine a position of an object in a first operating area and a second position measurement configuration to determine a position of the object in a second operating area;

a control unit for controlling a position of the object, the control unit comprising a first and second controller, the controllers being arranged to convert an input signal representing a position of the object to a resp. first and second control signal, the control unit being arranged to determine a combined control signal for controlling the position of the object in an overlapping area of the first and second operating area, whereby the combined control signal is obtained by applying a continuous weight function to the first and second control signal.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
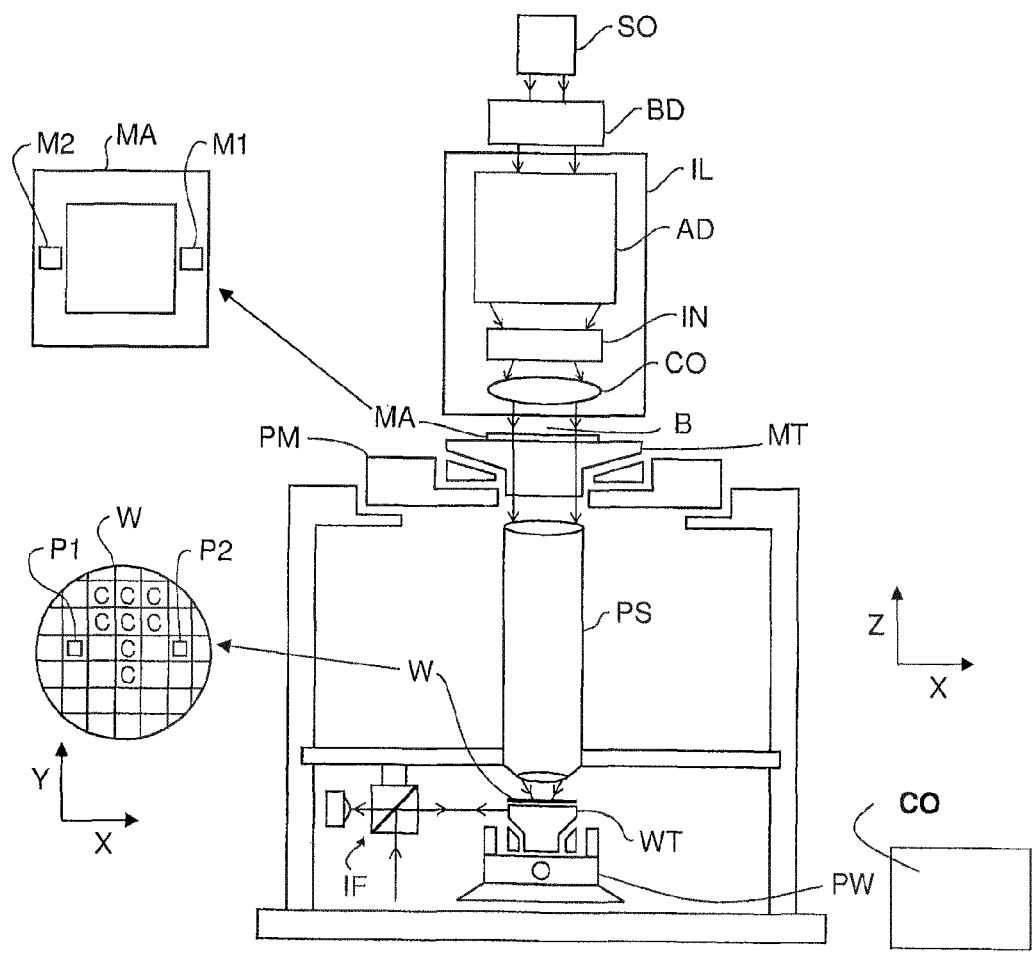
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan.

In accordance with an embodiment of the present invention, the position of the patterning device (MA) and/or the substrate W is controlled using a position control system, such position control system comprising a position measurement system such as the mentioned position sensor and a control unit CO for generating a control signal for e.g. controlling a positioning device, such as the mentioned first or second positioning device. In accordance with an embodiment of the present invention, the position measurement system as applied in the position control system comprising a first position measurement configuration, arranged to determine a position of an object, such as an object table supporting the patterning device MA or the substrate W, in a first operating area and a second position measurement configuration to determine a position of the object in a second operating area. In accordance with an embodiment of the present invention, the first and second position measurement configurations may include the use of different types of position sensors (e.g. a combination of an interferometer based system and an encoder based system) or may include different configurations of the same type of position sensors. As an example of the latter, the position of a substrate stage can e.g. be determined using an encoder based position measurement system including a target (e.g. one or more 1D or 2D gratings) and a plurality of encoder heads or sensors for co-operating with the target. In such arrangement, the first position measurement configuration can e.g. include a first set of encoder heads (of the plurality of encoder heads) whereas the second position measurement configuration can include a second, different, set of encoder heads.

Note that, in general, an object table such as a substrate table or support structure (e.g. mask table), needs to be displaced within a lithographic apparatus over a comparatively large operating area. Due to manufacturing limitations (e.g. limitations with respect to the available size of a target grating of an encoder based measurement system) or cost limitations, it may be advisable to use different measurement configurations in different areas in order to cover the entire operating area.

Merely as an illustration, the different areas may e.g. include a first area where the substrate is exposed, a second area where a height map of the substrate is generated and a transfer area that is covered when the substrate is displace from the second area to the first area. Note that in such arrangement, the position measurement system can e.g. include an encoder based position measurement system (as a first position measurement configuration) for measuring a position of the substrate when in the first area and an interferometer based measurement system for measuring a position of the substrate when in the transfer area. Note that, as an alternative, in the transfer area, an encoder based measurement system, e.g. having a grating with a lower resolution as a target, could also be applied as the second position measurement configuration.

When such different position measurement configurations are applied, care should be taken during the transition from operating using a first position measurement configuration to operating using a second position measurement configuration.

In US 2009/027907, it is suggested that, during a transition from operating using a first encoder head to operating using a second encoder head, a weight function is applied to the position signals obtained from the encoder heads or sensors to generate an input signal for a controller that is used to control a position of the stage or object table.

However, in accordance with an embodiment of the present invention, it is recognized that an important performance gain can be realized when multiple controllers are applied in the control unit CO (see FIG. 1) to control a position of an object in case a position measurement system having different configurations is used to determine the position of the object. This can be understood as follows:

In order to accurately control a position of an object, in particular a substrate in a lithographic apparatus during an exposure sequence, it is desirable that a controller is applied that has a comparatively high bandwidth. Within the present invention, the term 'controller' is used to denote a component which converts an input signal representing a position of an object or a position error of an object to a control signal, whereby the control signal can e.g. be used to control an actuator or motor that is arranged to displace the object, in order for the object to following, as accurate as possible, a desired trajectory. In this respect, it can be mentioned that a controller having a comparatively high bandwidth helps in achieving this objective because a high bandwidth controller enables a comparatively fast response to a position error, i.e. a difference between a desired position and an actual position.

However, when designing a controller for controlling a position of an object, whereby the position of the object is measured with a particular position measurement system or a particular position measurement configuration, care should be taken to ensure that the controller remains stable in the operating area. In particular, the bandwidth that can be realized depends on the open loop mechanical behavior of the object as observed by the position measurement system, or more specific by a particular position measurement configuration. In this respect, it has been observed that, in case different position measurement configurations are applied, important variations can be observed in the open loop mechanical behavior (or frequency response) as observed by the different configurations. As an example (which will be explained in more detail below), particular deformations or eigen frequencies or eigen modes, may or may not be visible in the open loop frequency response, depending on the position measurement configuration used. As such, when designing a controller for a given open loop frequency response, such a controller should be tailored to the open look frequency response, in order to have an optimal bandwidth. In case different position measurement configurations are to be used in an operating area, said configurations having different open loop frequency responses, the design of a single controller, designed to operate with sufficient stability margin in combination with all different position measurement configurations, will result in a controller having a comparatively poor performance compared to a controller that is tailored to only be used in combination with a particular position measurement configuration.

In other words, referring to the example given above, when a controller is optimized for operation in a exposure area of a lithographic apparatus, thereby receiving an input signal comprising a position signal of an encoder based position measurement system, that controller might be unsuited (i.e. insufficiently stable) to control the position of the object in the transfer area where another position measurement configuration is used, due to the large difference in open loop frequency response as observed using the different measurement configuration. So, when such a single controller needs to be stable in combination with both position measurement configurations (occurring in the exposure area and the transfer area), the controller may have a comparatively low bandwidth compared to the optimized controller that only needs to be stable in combination with a single position measurement configuration.

In order to avoid that a controller having a comparatively low bandwidth needs to be used, the control unit of an embodiment of the present invention provides in the use of several controllers in different operating areas, whereby a smooth transition is provided during a transfer from one operating area (in which a particular position measurement configuration is used) to another operating area (in which another position measurement configuration is used). In particular, the control unit as used in the position control system or lithographic apparatus according to an embodiment of the invention comprise at least a first and second controller, the controllers being arranged to convert an input signal representing a position of the object to a respective first and second control signal, and wherein the control unit is arranged to determine a combined control signal for controlling the position of the object in an overlapping area of a first operating area (where a first position measurement configuration of the position measurement system is used) and a second operating area (where a second position measurement configuration of the position measurement system is used), whereby the combined control signal is obtained by applying a continuous weight function to the first and second control signal. By doing so, a smooth transition can be realized from operating with a first controller, which might be optimized for use in the first operating area to operating with a second controller, a more robust, global controller that is suited for operation in both the first and second operating area. In this respect, 'global' is used to denote that the controller is designed to operate in both the first and second operating area. Such an controller will in general be more robust as it needs to meet different stability requirements in the different operating areas.

Note that, in accordance with an embodiment of the present invention, a transition from operating with the first controller to operating with the second controller (or vice versa) occurs in an overlapping area of the first and second operating area. In this respect, it is worth mentioning that, in case such an overlapping area would not exist and would thus be zero, a hard switching between controllers would be required. It has been noted by the inventors that such an immediate hard switching would result in a large position error. In case of an application in a lithographic apparatus, such position error would not be settled before the start of an exposure sequence, thus deteriorating the exposure performance.

As a result of the use of multiple controllers and the mentioned transition between different controllers, the first controller, which can be optimized for use in the first operating area (and thus not need to be stable in the second operating area) can have a higher bandwidth than the second controller, which needs to be stable in both the first and second operating area.

In general, movement of the support structure (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the support structure (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the support structure (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
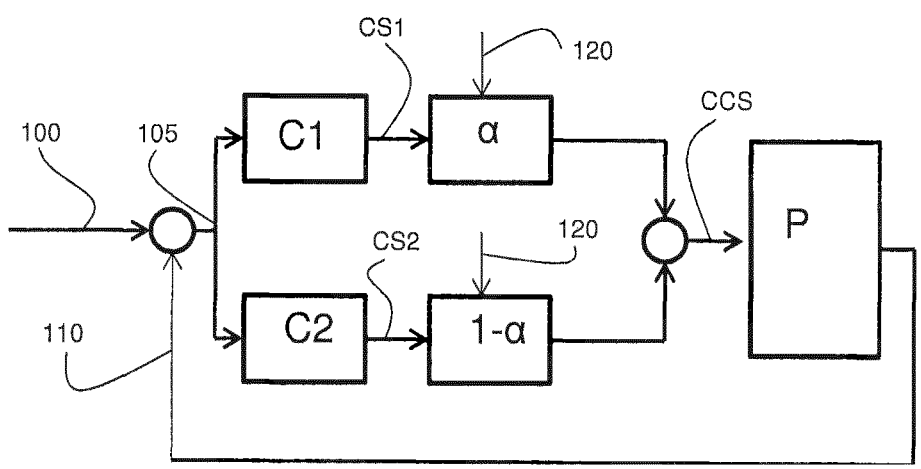
FIG. 2 schematically depicts a control scheme as can be applied in a position control system according to an embodiment of the invention.

In FIG. 2, a control scheme of a position control system according to an embodiment of the present invention is schematically shown. In the control scheme, P represents the process that is being controlled, e.g. the position of an object table in a lithographic apparatus. Signal 100 represents a set point for the process to be controlled, e.g. a desired position or trajectory of an object table.

A feedback signal 110 representing an actual state, e.g. a position of an object table is fed back and compared with the set point 100. The difference between the set point 100 and the actual value 110 is provided as an input signal 105 to a first C1 and second C2 controller. Subsequently, the output signals of the controllers, i.e. first CS1 and second CS2 output signal are weighted (represented by the weight function $\alpha$) and combined to form a combined control signal CCS for the process P. In accordance with an embodiment of the present invention, the weight function $\alpha$ is a continuous function, thus enabling a smooth transition between an operation using the first controller C1 and a second controller C2.

In accordance with an embodiment of the present invention, the transition from controlling a position of an object (represented by process P as shown in FIG. 2) with a first controller C1 to controlling the position with a controller C2 (or vice versa) is performed in an overlapping area of two operating areas of the object, whereby different position measurement configurations are or can be applied in two operating areas. More details on the different position measurement configurations and operating areas is provided below. As such, the feedback signal 110 comprises, in the position control system according to an embodiment of the invention, a position signal representing a position of the object. As indicated, different position measurement configurations are available in the overlapping area where the transition occurs. As such, the feedback signal can comprise position measurement signals from either position measurement configuration or a combination thereof. Note that, in an embodiment, both controllers C1 and C2 need not use the same position measurement signals. In the overlapping area of two operating areas of the object, a combined control signal CCS is generated as a weighted combination of the output signals CS1 and CS2 of the controllers C1 respectively C2. In accordance with an embodiment of the present invention, the weighted combined control signal CCS is used to control the process P, e.g. a positioning of an object such as an object table. The combined control signal may thus be described as:

$$CCS=CS1*\alpha+CS2*(1-\alpha) \quad (1)$$

Wherein $\alpha$ is the applied weight function. In general, $\alpha$ may vary between values 0 and 1 in a continuous manner. In an embodiment, the weight function $\alpha$ is determined as a function of the position of the object. In such an embodiment, an actual value for the weight function $\alpha$ (i.e. for a given position) can be determined from the feedback signal 110 which includes a position signal representing a position of the object. Alternatively, the set point 100 can be used as input to determine an actual value of $\alpha$. As such, in an embodiment, the weight factor $\alpha$ is based on a weight signal 120 which may represent an actual position of the object (and thus be derived from the feedback signal 110) or a desired position of the object, as e.g. represented by the set point 100.

In an embodiment, the feedback signal 110 which can be deducted from the set point 100 (to obtain the input signal 105) may comprise a first position signal representing a position of the object obtained from a first position measurement configuration of the process P and a second position signal representing a position of the object obtained from the second position measurement configuration, whereby the first and second position signals can, after deduction from the set point 100 can being provided to respectively the first and second controller as a first and second input signal respectively. In such embodiment, each controller is thus provided with its own input signal obtained from a particular position measurement configuration.

As an alternative, one or more of the controller may be provided with a weighted input signal obtained by weighting a first position signal, obtained from a first position measurement configuration, with a second position signal, obtained from a second position measurement configuration. As an example, a more robust controller, e.g. controller C2 can be provided with a weighted input signal: in such arrangement, the input signal may thus comprises a first input signal comprising a first position signal representing a position of the object obtained from a first position measurement configuration of the process P and a second input signal comprising a weighted position signal obtained by applying the continuous weight function $\alpha$ to the first position signal and a second position signal representing a position of the object obtained from the second position measurement configuration, the first and second input signal being provided to respectively the first (C1) and second (C2) controller.

In an embodiment of the present invention, a transition from controlling a position of an object using a first controller for controlling a position of an object using a second controller is done to enable a more performing controller to be applied in a particular operating area. Using the transition as proposed in an embodiment of the present invention, a high performance controller, e.g. desired in a first operating area, need not be stable in a second operating area, because, outside the first operating area, a second, more robust controller can take over the position control, such robust controller being stable for the first operating area, the second operating area and the overlapping area. Note that, as has been devised by the inventors, the options available for designing a controller may be limited by conditions with respect to stability which need to be met in the entire operating area where the controller needs to be applied. It has further been noted by the inventors that these stability conditions may vary substantially, depending on the open loop frequency response of the system or process to be controlled and that such an open loop frequency response may depend, in case of a position control system, on the position measurement system available. As such, when, in order to cover a comparatively large operating area, different position measurement systems or configurations need to be used, different stability conditions or requirements need to be met. If all these conditions have to be met by a single controller, such a controller may have a reduced performance, e.g. with respect to bandwidth, compared to a controller that only needs to be stable in part of the operating area, where a single position measurement configuration can be used. When, in a particular operating area of interest, e.g. an exposure area of a lithographic apparatus, a dedicated controller can be applied, e.g. a controller having a larger bandwidth, an important performance improvement can be realized.

In the following figures, the above is illustrated for an encoder based position measurement system, whereby, depending on an object's position, different position measurement configurations are available.

Figure 3A:
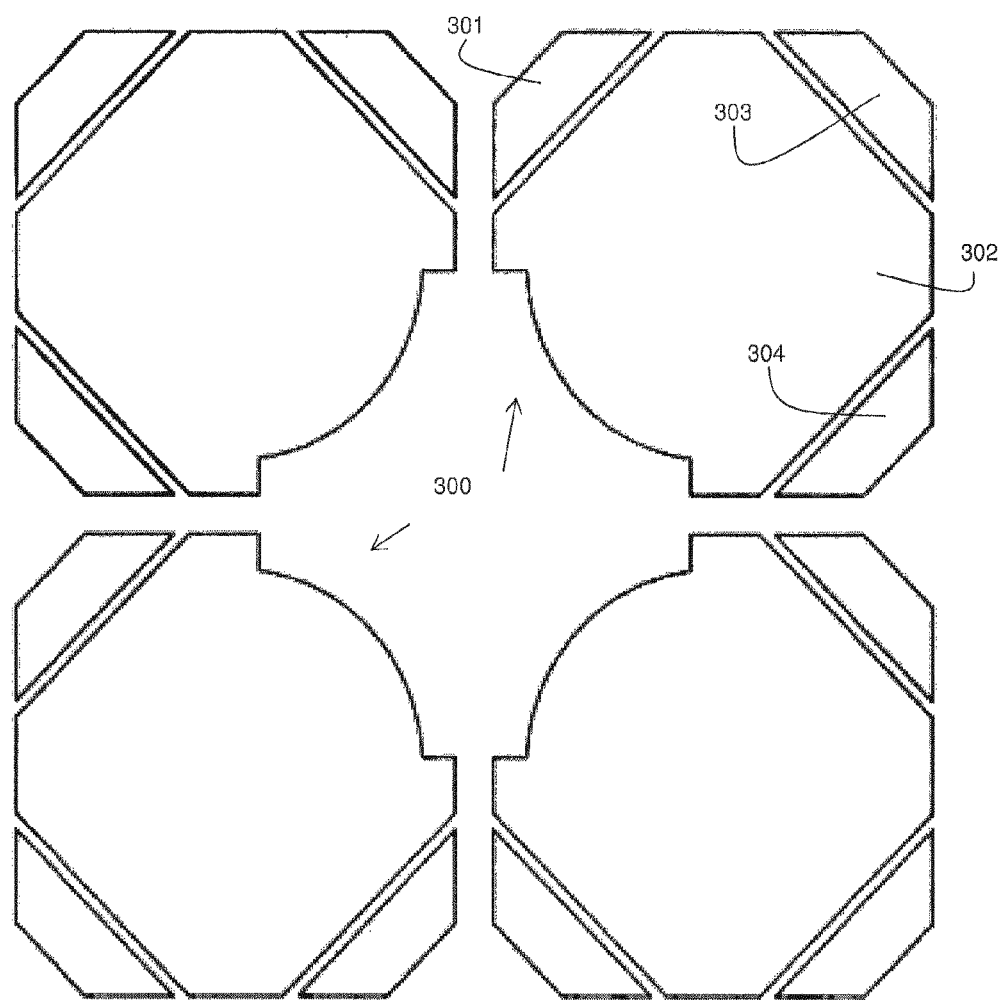
FIGS. 3a to 3e schematically depict a position measurement system as can be applied in a position control system according to an embodiment of the present invention.

In FIG. 3a, a plan view of a 2D encoder grating 300 is schematically shown as can be used in a lithographic apparatus for positioning an object table provided with a substrate during an exposure sequence. As can be seen, in each quadrant, the grating consists of 4 separate gratings (e.g. gratings 301, 302, 303 and 304 in the upper right quadrant, each of said gratings can e.g. be provided with a 2D pattern which can be used as a target for a measurement beam originating from an encoder head. Note that a reason for providing the target grating in such a segmented form may be a manufacturing limitation. As such, in order to cover an area that is larger than the size of a single grating, several gratings can be placed adjacent each other. Note that, in the arrangement as shown, a central portion of the grating assembly is kept open, in order to allow the projection beam to pass towards the substrate.

Figure 3B:
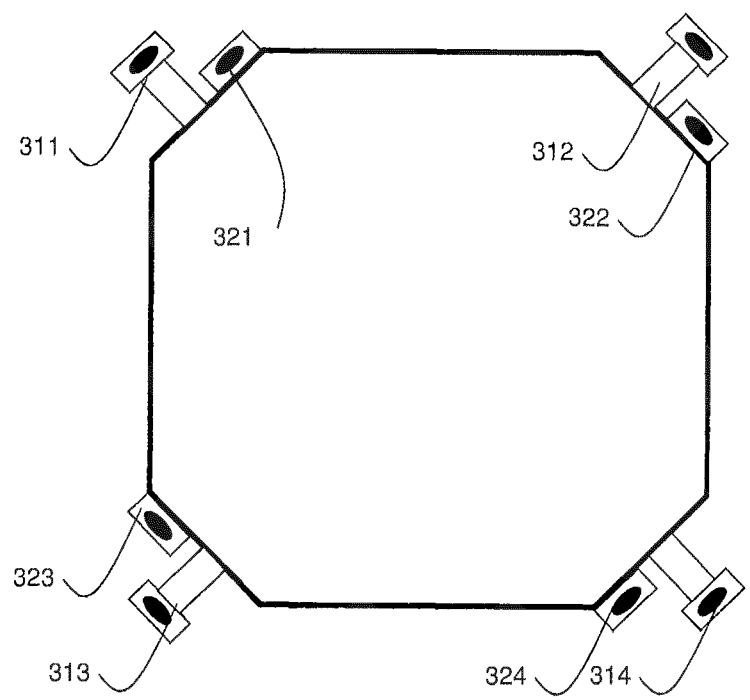

In FIG. 3b, a schematic plan view of an object table is shown having encoder sensors (also referred to as encoder heads or encoders) mounted thereto. In the arrangement as shown, the object table is equipped with 4 main encoders (311, 312, 313, 314) and 4 auxiliary encoders (321, 322, 323, 324).

Figure 3C:
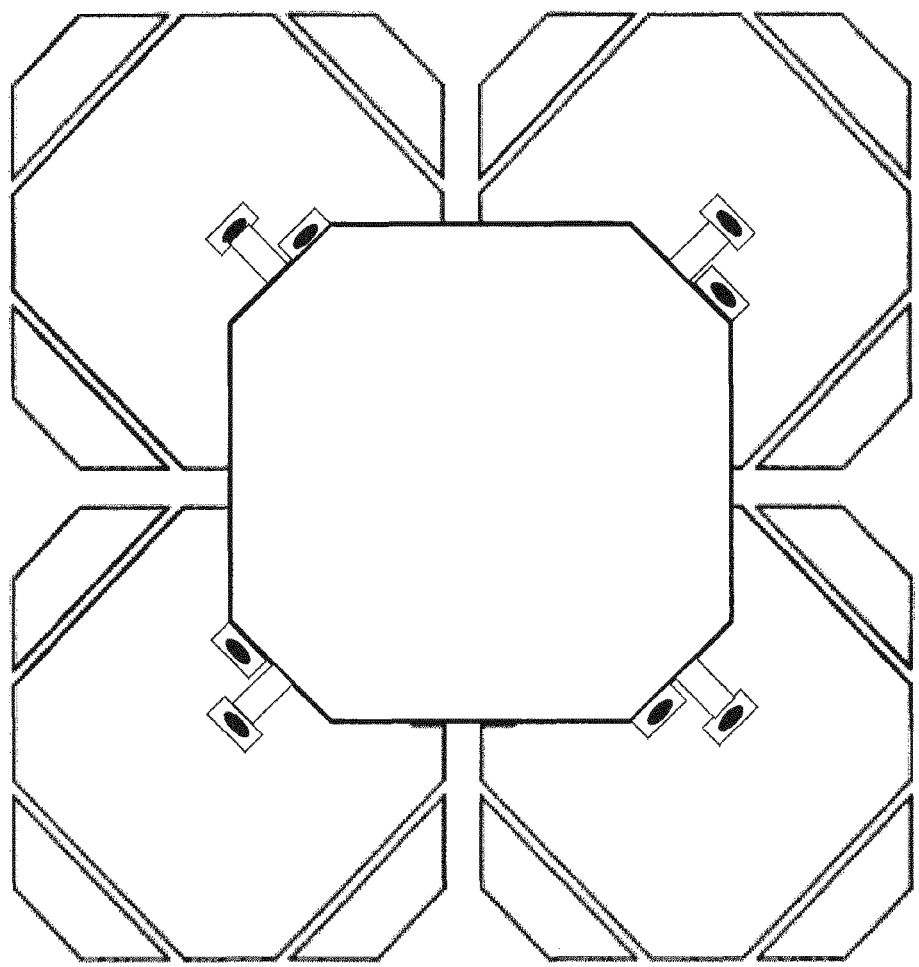

In FIG. 3c, the grating arrangement of FIG. 3a is shown together with the object table of FIG. 3b.

As can be seen, when the object table is in a central position or area, relative to the grating, the set of 4 main encoders can be used to provide a position signal which can e.g. be used as a feedback signal for a controller, such as the feedback signal 110 as shown in FIG. 2. As an example, each of the 4 main encoders can e.g. be configured to provide a 2D position signal (e.g. an X,Z or Y,Z position signal) such that, when the main encoders are operational, they provide sufficient information to determine the position of the object table in 6 DOF (degrees of freedom). Note that, for the given arrangement, it may be sufficient to retrieve a signal from either 3 main encoders or 3 auxiliary encoders to determine a position of the object table in 6 DOF.

Due to the gaps between the different grating segments and the central portion where a grating is lacking, the 4 main encoders may not all be facing an encoder grating when the object table is moved away from a central position or area.

Figure 3D:
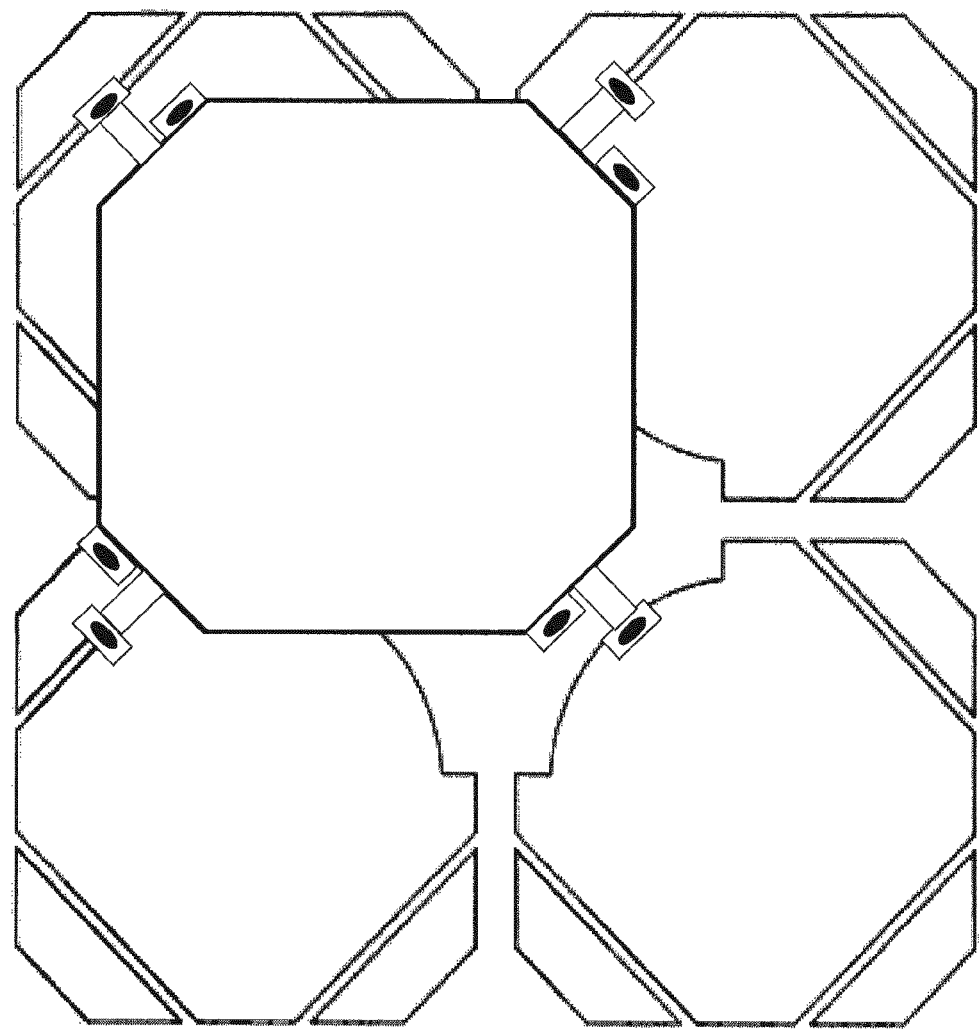

As an example, in the position as shown in FIG. 3d, one main encoder is facing a grating, the other main encoders are either facing a gap between gratings or the central portion where a grating is lacking.

Note that, for the given position, a set of three auxiliary encoders are facing a grating and may thus provide the necessary position signals for determining the 6 DOF position of the object table. As such, due to the use of the auxiliary encoders, one can ensure that, when not all 4 main encoders are operational (i.e. are not all facing a grating in order to provide a position signal), another set of encoders, either 3 main encoders or 4 or 3 auxiliary encoders are available for providing position signals enabling the determination of the position of the object table in 6 DOF. Given the layout of the gratings (see FIG. 3a) and of the encoders on the object table (see FIG. 3b), one can devise the boundaries or areas where a particular set of encoders is available for co-operating with a grating.

Figure 3E:
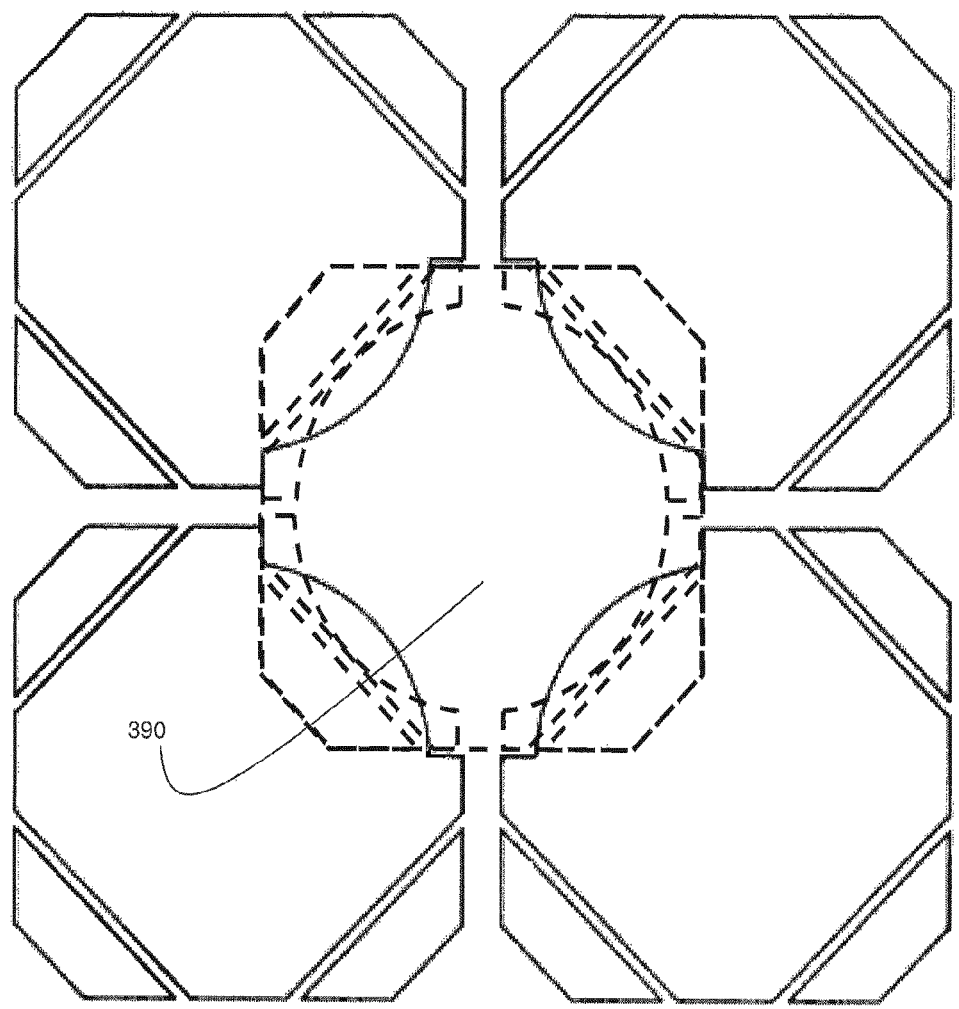

In FIG. 3e, these boundaries/areas are schematically shown (in dotted lines) projected on the grating layout of FIG. 3a.

In each of the areas, a set of at least three encoders is available, i.e. either a set of 3 auxiliary encoders or 3 main encoders. In the central, substantially circular area 390, the 4 main encoders are available.

Note that this central area is of particular interest in that it includes the area covered by the object table during the exposure of the substrate.

As will be clear from the above, one may thus, for a given encoder and target configuration, identify different areas where different encoder-grating combinations, in general, position measurement configurations, are available for determining the position of the object table.

Given the position measurement system, i.e. the encoder-grating configuration as described above, the present invention may beneficially be applied as follows.

An embodiment of the present invention enables a transition from controlling a position of an object (e.g. an object table as used in a lithographic apparatus) with a first controller to controlling a position of the object using a second controller. Referring to the arrangement as explained in FIGS. 3a-3e, a position control system according to an embodiment of the present invention may thus comprise a first controller which is configured to control a position of the object table, based on a position feedback obtained from a position measurement using the 4 main encoders. The position control system may further comprise a second controller which is configured to control a position of the object table based on a position feedback obtained from a position measurement using the 4 main encoders or 3 main encoders or 3 or 4 auxiliary encoders.

In the following figures it will be illustrated that, in order to ensure proper i.e. stable operation, the second controller needs to meet additional requirements that may affect the bandwidth that can be realized for this controller. This is due to the fact that the second controller needs to remain stable for different position measurement configurations as indicated above.

This can be illustrated by considering the open loop frequency response of the object table for the different position measurement configurations as has been described.

Figure 4A:
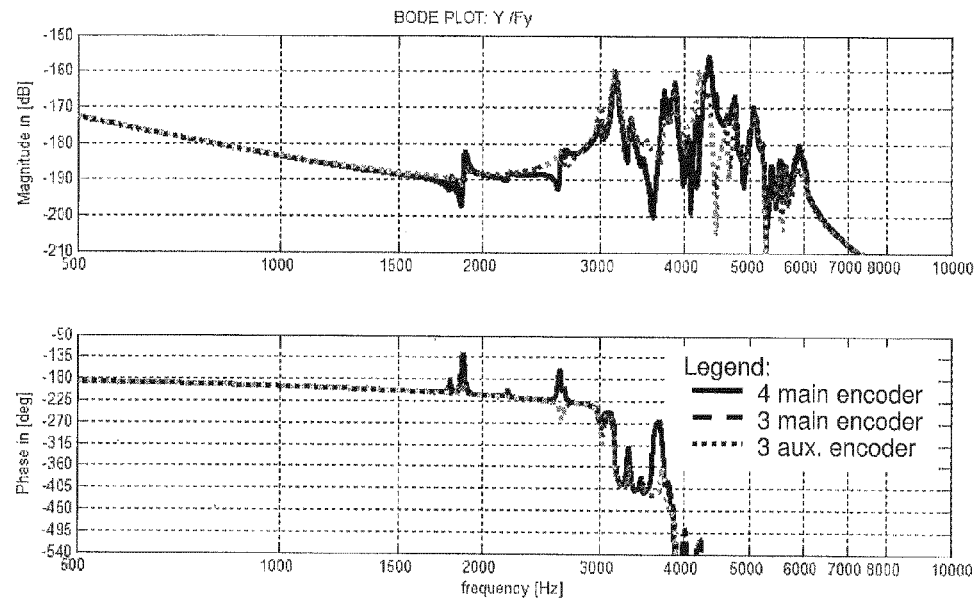
FIGS. 4a and 4b schematically depict differences between open loop frequency responses as can be observed when different position measurement configurations are considered.

In FIG. 4a, the open loop frequency response (magnitude and phase as a function of frequency) for the horizontal Y-direction is schematically shown for three different position measurement configurations whereby 4 main encoders, 3 main encoders and 3 auxiliary encoders are available. Comparing the graphs teaches that the frequency responses are different. Note that, for the response shown in FIG. 4a, the graphs for the 4 main encoders and the 3 main encoders overlap. For the shown configuration, the position measurement configurations with 4 or 3 main encoders may have a different gain and/or phase in a specific frequency range, e.g. near 2600 Hz. Further, different frequency components can be observed near the 4000 Hz range.

Figure 4B:
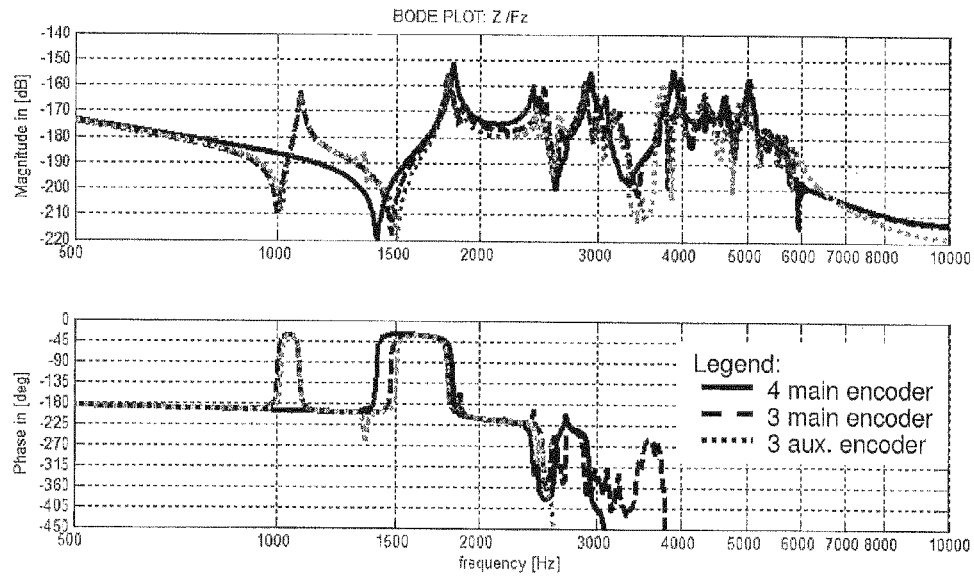

In FIG. 4b, the open loop frequency response is given for the vertical Z-direction for the same configurations as in FIG. 4a, i.e. for position measurement configurations whereby 4 main encoders, 3 main encoders and 3 auxiliary encoders are available.

As can be observed in the open loop response, a torsion deformation mode can be seen, near the 1100 Hz range, in the configurations whereby only 3 encoders are available. Further, different frequency components can be observed near 3000 Hz when comparing the 4 main encoder configuration with the 3 main encoder configuration. In order to ensure a sufficient stability margin in a controller receiving a position feedback signal that is only based on 3 encoders, the bandwidth of the second controller will be smaller than the available bandwidth of a controller that only needs to operate based on a position feedback signal of the 4 main encoders, e.g. due to a required additional filtering that may need to be applied in the second controller.

For a particular position measurement system, the inventors have noted that the second controller, i.e. the controller that is suited for operating with all position measurement configurations may have a bandwidth that is 20% smaller in X, Y and Z-direction than the bandwidth of the first controller, which only needs to be suited for operating with the 4 main encoders configuration.

Such a reduction in bandwidth has an important effect on the positional accuracy which can be realized. In theory, the servo error from disturbances is, for low frequencies, proportional to the power −3 of the bandwidth, whereas for frequencies near the bandwidth, the servo error is proportional to the power −2 of the bandwidth.

In lithographic apparatuses it is accustomed to use moving average (MA) and moving standard deviation (MSD) as dynamic performance indicators for the substrate positioning error. The reduction in bandwidth in particular has an effect on the MA indicator; a 20% reduction in bandwidth can result in an increase in the MA indicator (which is strongly related to overlay or focusing error) of approximately 1.6.

As such, an important gain in performance can be realized when the first controller can be applied in the area of interest, i.e. the area covered during the exposure of the substrate. In order to realize this, the substantially circular area 390 as shown in FIG. 3e has a radius that is larger or equal to the radius of a substrate to be processed. Even more desirable, the area has a radius that is at least 15 mm larger that the radius of the substrate to be processed.

As a typical example, a substrate having a radius of 225 mm can be considered. In such example, the position measurement system, in particular the grating and encoder layout, can be designed such that the area wherein 4 main encoders are available has a radius of e.g. 240 or 245 mm. When outside this radius, the 4 main encoders are no longer available, but only a subset of 3 main encoders or 3 or 4 auxiliary encoders. Assuming such a configuration, the area having a radius R, whereby 225>R>240 can thus be used for realizing a transition from operating under the control of the second controller to operating under the control of the first controller. Such a situation may e.g. occur when a target portion (or die) near the edge of the substrate needs to be exposed. In such situation, the object table may initiate an exposure sequence (which includes an acceleration stage, a constant velocity stage during with the exposure is performed and a deceleration stage) of the target portion starting from a position outside the area where 4 main encoders are available, e.g. at a radius R=250 mm. In such operating point, the second more robust controller will be operational. When arriving at a position whereby the 4 main encoders become available, the smooth transition from operating under the control of the second controller to operating under the control of the first controller. During such transition, the output signals of the first and second controller are combined using a continuous weight function. As an example, the weight function can be a linear or polynomial function varying from 0 to 1 as a function of the radius R. In an embodiment, the transition is completed (i.e. the first controller has taken over full control) before the edge of the substrate is reached. As an example, the transition may occur between positions at a radius R=240 mm and positions at a radius R=230 mm. The remaining distance to the edge of the substrate allows for transient phenomena of the controller to settle. As a result, once the object arrives at a position where the edge of the substrate is below the exposure beam, i.e. at R=225, the object is under accurate control of the high bandwidth first controller.

The above described position control system may, as mentioned be applied in a lithographic apparatus for controlling a position of a substrate stage.

Figure 5:
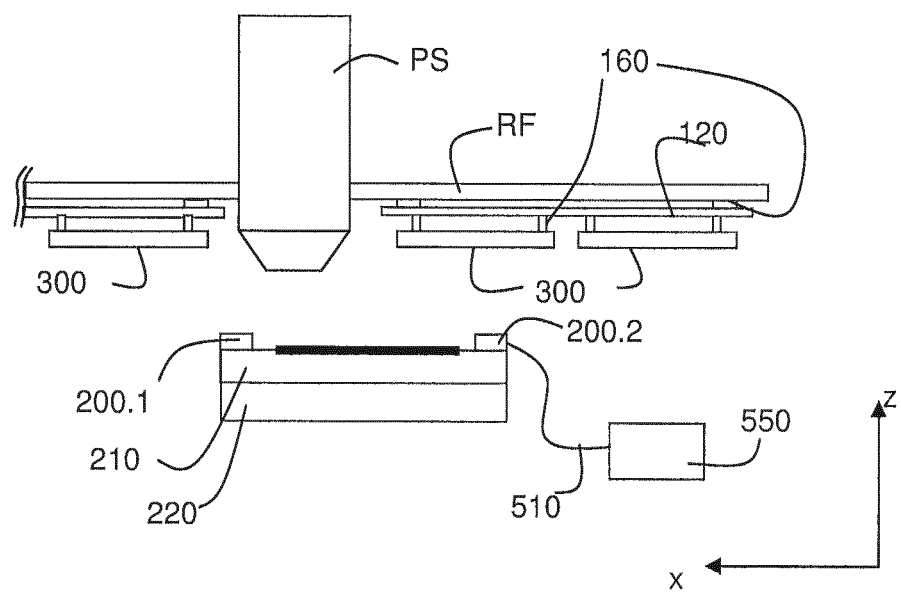
FIG. 5 schematically depicts a lithographic apparatus according to an embodiment of the present invention.

In FIG. 5, such an arrangement is schematically shown. In FIG. 5, an embodiment of a position control system according to an embodiment of the invention is schematically shown, the position control system comprising a position measurement system comprising a plurality of encoder gratings 300 co-operating with encoders (encoders heads or sensors) 200.1, 200.2, to provide a position signal 510 to a control unit 550 of the position control system. In the arrangement as shown, the gratings 300 are mounted to a common frame 120 of the measurement system (the frame e.g. being made from Zerodur or any other type of low thermal expansion material) which can e.g. be mounted to a reference frame RF such as a metrology frame MF to which a projection system PS (see FIG. 1) is also mounted. In the embodiment shown, the sensors 200.1 and 200.2 are mounted to an object table 210 which can e.g. be a substrate table that is mounted to a positioning device 220 for displacing the object table 210 relative to the projection system PS, e.g. using linear motors or actuators.

During operating, the sensors can provide a signal 510 to the control unit 550, the signal e.g. representing the position of the sensor 200.1 relative to the grating 300. Note that in general, the position signal may represent a position in a horizontal direction (in the XY-plane) or the vertical direction (Z-direction), or a combination thereof. In an embodiment, the object table 210 is provided with four encoder sensors, each sensor being arranged to provide a two-dimensional position signal to the processing unit. In accordance with an embodiment of the present invention, the control unit 550 comprises a first and second controller as described above.

An embodiment of the present invention may also be applied for different position measurement configurations. As a first example, see FIG. 6(a), a top view of an encoder based measurement system is schematically shown, the system comprises 4 sensor arrays 400.1, 400.2, 400.3 and 400.4 (each comprising a plurality of sensors 405) that can e.g. be mounted to a reference frame (not shown) such as the metrology frame MF of FIGS. 1 and 4 gratings 410.1-410.4 that are mounted to a substrate table arranged to hold a substrate 430. Compared to the arrangement of FIG. 5, the gratings are thus mounted to the object table. By using 4 sensor arrays in the arrangement as shown, the stage can cover a comparatively large operating area under control of the sensors while maintaining the gratings (that are mounted to the stage) comparatively small. When any of the sensors of the arrays is above any of the gratings, a position signal can be obtained and used in a similar manner as described above. As indicated above, each set of 4 encoders may enable determining a position of the substrate table in 6 DOF. Note that, when a transition is made from a measurement using a particular combination of 4 sensors to a measurement using another combination of 4 sensors, the different sets of sensors can be considered different position measurement configurations as applied in an embodiment of the present invention. As explained above, the different position measurement configurations may give rise to different open loop frequency responses, due to the different mechanical layout of the configurations. As such, it may be beneficial to design a dedicated controller for a particular position measurement configuration or a combination of some position measurement configurations that may have a similar open loop frequency response.

Figure 6:
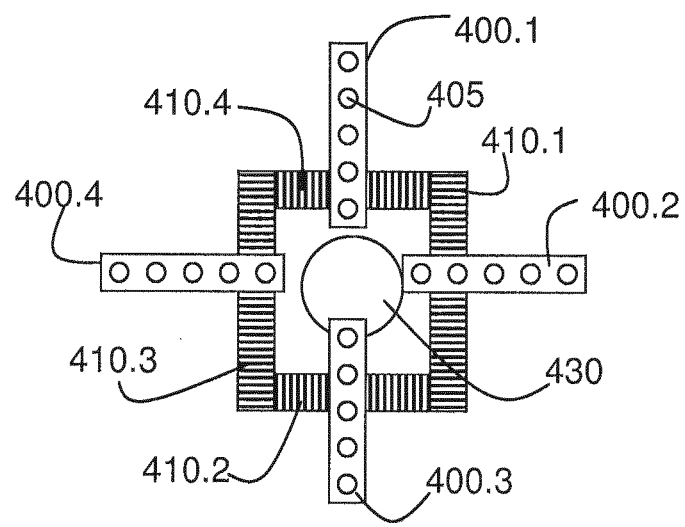
FIGS. 6a and 6b schematically depicts two other position measurement systems as can be applied in a position control system according to an embodiment of the present invention.
Figure 6:
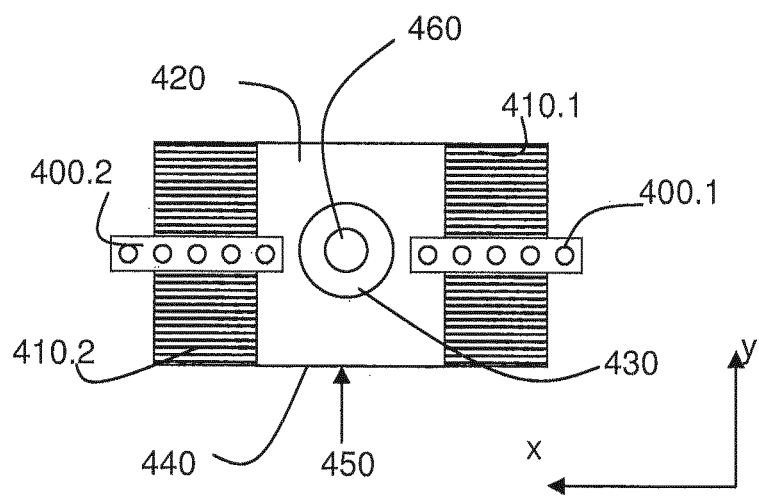

In FIG. 6(b), an alternative arrangement is shown whereby only two gratings 410.1 and 410.2 are applied on opposite sides of the substrate table 420 and two sensor arrays 400.1 and 400.2 for co-operation with the gratings. In such arrangement, the gratings can e.g. be two-dimensional gratings, whereby the sensors are e.g. arranged to provide a three-dimensional position signal (x,y,z) to the processing unit. The arrangement as shown is particularly suited for use in an immersion type of lithographic apparatus whereby a displacement of the substrate table from underneath the projection system can take place without immersion fluid having to pass over the gratings. In the Figure, the area indicated by 460 can e.g. represent the area underneath the projection system (not shown) that is covered with immersion fluid during use. As can be seen, a displacement of the substrate table in the y-direction enable the table 420 to be moved away from the immersion liquid without the immersion liquid touching the gratings. Note that, in order to maintain positional information on the substrate table when moving away from the projection system, additional or larger sensor arrays can e.g. be applied. Additional sensor arrays can e.g. be positioned at different y-positions when the substrate table is moved in the positive Y-direction. Again, each distinct combination of sensors co-operating with the gratings can be considered a distinct position measurement configuration of the position measurement system and, a dedicated controller may be applied for the distinct configurations.

As a second example, as an alternative to applying extensive comparatively large gratings or sensor arrays, the substrate table 420 or 210 can be provided with a reflective surface acting as a target surface for an interferometer beam of an interferometer based position measurement device.

As such, in accordance with an embodiment of the present invention, the position measurement system of the position control system may have first position measurement configuration having an encoder based arrangement as e.g. described above and a second position measurement configuration having an interferometer based arrangement. As a possible use, the encoder based configuration can e.g. be applied in an exposure area where an accurate positioning using a dedicated controller is applied, while in a transfer area, e.g. an area covered when a substrate is displaced from a measurement station to an exposure station, the interferometer based configuration is used, combined with a more robust controller that is adapted to process position feedback signal of both measurement configurations.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A position control system comprising:
a position measurement system comprising a first position measurement configuration arranged to determine a position of an object in a first operating area and a second position measurement configuration to determine a position of the object in a second operating area;
a control unit configured to control a position of the object, the control unit comprising a first and second controller, the first and second controllers being arranged to convert a same input signal representing a position of the object to a respectively first and second control signal, the control unit being arranged to determine a combined control signal for controlling the position of the object in an overlapping area of the first and second operating area, wherein the combined control signal is obtained by applying a continuous weight function to the first and second control signal.

2. The position control system according to claim 1, wherein the weight function is a function of the position of the object or of a set point of the object.

3. The position control system according to claim 1, wherein the first controller is adapted to determine the first control signal based on an input signal comprising a position signal of the first position measurement configuration.

4. The position control system according to claim 1, wherein the input signal is obtained by applying the continuous weight function to a first input signal comprising a position signal of the first position measurement configuration and a second input signal comprising a position signal of the second position measurement configuration.

5. The position control system according to claim 1, wherein the position measurement system comprises an encoder based position measurement system including a 2D encoder target and a plurality of encoder heads for co-operating with the 2D encoder target, and wherein the input signal is based on a position signal received of the plurality of encoder heads.

6. The position control system according to claim 5, wherein the first controller is adapted to control a position of the object in the first operating area and wherein the second controller is adapted to control a position of the object in both the first and second operating area.

7. The position control system according to claim 5, wherein the plurality of encoder heads comprises 4 encoder heads for co-operating with the 2D encoder target in the first operating area and a subset of 3 encoder heads of the 4 encoder heads arranged to co-operate with the 2D encoder target in the second operating area.

8. The position control system according to claim 5, wherein, for any position of the object, at least three of the plurality of encoder heads co-operate with the 2D encoder target.

9. The position control system according to claim 1, wherein the input signal comprises a first input signal comprising a first position signal representing a position of the object obtained from the first position measurement configuration and a second input signal comprising a second position signal representing a position of the object obtained from the second position measurement configuration, the first and second input signal being provided to respectively the first and second controller.

10. The position control system according to 1, wherein the input signal comprises a first input signal comprising a first position signal representing a position of the object obtained from the first position measurement configuration and a second input signal comprising a weighted position signal obtained by applying the continuous weight function to the first position signal and a second position signal representing a position of the object obtained from the second position measurement configuration, the first and second input signal being provided to respectively the first and second controller.

11. A lithographic apparatus comprising: a
an illumination system configured to condition a radiation beam;
a support constructed to support a patterning device, the patterning device being capable of imparting the radiation beam with a pattern in its cross-section to form a patterned radiation beam;
a substrate table constructed to hold a substrate;
a projection system configured to project the patterned radiation beam onto a target portion of the substrate, and
a position control system according to claim 1, wherein the object comprises the support or the substrate table.

12. A device manufacturing method comprising projecting a patterned beam of radiation onto a substrate, wherein a positioning of the substrate is performed using a lithographic apparatus according to claim 11.

13. A lithographic apparatus comprising:
an illumination system configured to condition a radiation beam; a support constructed to support a patterning device, the patterning device being capable of imparting the radiation beam with a pattern in its cross-section to form a patterned radiation beam;
a substrate table constructed to hold a substrate;
a projection system configured to project the patterned radiation beam onto a target portion of the substrate, and
a position control system for controlling a position of the substrate table, the position control system comprising
a position measurement system comprising a first position measurement configuration arranged to determine a position of the substrate table in a first operating area and a second position measurement configuration to determine a position of the substrate table in a second operating area;
a control unit configured to control a position of the substrate table, the control unit comprising a first and second controller, the first and second controllers being arranged to convert a same input signal representing a position of the substrate table to a respectively first and second control signal, the control unit being arranged to determine a combined control signal for controlling the position of the substrate table in an overlapping area of the first and second operating area, wherein the combined control signal is obtained by applying a continuous weight function to the first and second control signal.

14. The lithographic apparatus according to claim 13, wherein the first position measurement configuration comprises an encoder based position measurement configuration and the second position measurement configuration comprises an interferometer based position measurement configuration.

15. The lithographic apparatus according to claim 13, wherein the position measurement system comprises an encoder based position measurement system including a 2D encoder target mounted to the substrate table and a plurality of encoder heads mounted to a substantially stationary frame of the apparatus for co-operating with the 2D encoder target, and wherein the input signal is based on a position signal received of the plurality of encoder heads.

* * * * *